United States Patent
Zheng

(10) Patent No.: US 10,950,173 B2
(45) Date of Patent: Mar. 16, 2021

(54) ORGANIC LIGHT-EMITTING DISPLAY PANEL AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventor: Kening Zheng, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/323,071

(22) PCT Filed: May 11, 2018

(86) PCT No.: PCT/CN2018/086600
§ 371 (c)(1),
(2) Date: Feb. 4, 2019

(87) PCT Pub. No.: WO2018/219127
PCT Pub. Date: Dec. 6, 2018

(65) Prior Publication Data
US 2019/0180685 A1 Jun. 13, 2019

(30) Foreign Application Priority Data
May 27, 2017 (CN) .......................... 201710393127.8

(51) Int. Cl.
*G09G 3/3233* (2016.01)
*H01L 51/52* (2006.01)
(Continued)

(52) U.S. Cl.
CPC ......... *G09G 3/3233* (2013.01); *G09G 3/3225* (2013.01); *H01L 51/5203* (2013.01);
(Continued)

(58) Field of Classification Search
CPC ............... G09G 3/3233; G09G 3/3225; G09G 2320/041; G09G 3/3258; G09G 2330/021;
(Continued)

(56) References Cited

U.S. PATENT DOCUMENTS

2003/0112208 A1* 6/2003 Okabe .................. G09G 3/3233
345/82
2006/0244695 A1 11/2006 Komiya
(Continued)

FOREIGN PATENT DOCUMENTS

CN   1874627 A  12/2006
CN  101276542 A  10/2008
(Continued)

OTHER PUBLICATIONS

Office Action for corresponding Chinese Application 201710393127.8 dated Aug. 29, 2018.
(Continued)

*Primary Examiner* — Bitew A Dinke
(74) *Attorney, Agent, or Firm* — Arent Fox LLP; Michael Fainberg

(57) ABSTRACT

An organic light-emitting display panel and a display device, comprising: multiple light-emitting components; pixel circuits connected one-to-one to the light-emitting components, the pixel circuits being connected to corresponding first poles of the light-emitting components, second poles of the light-emitting components being connected to first power ends; diversion modules corresponding one-to-one to the light-emitting components, wherein the diversion modules are connected at first ends thereof to the corresponding first poles of the light-emitting components and connected at second ends to the corresponding second poles of the light-emitting components, and the diversion modules are
(Continued)

used for diversion with respect to the corresponding light-emitting components when the temperature of the organic light-emitting display panel satisfies a selected temperature range.

8 Claims, 4 Drawing Sheets

(51) Int. Cl.
    *G09G 3/3225*     (2016.01)
    *G09G 3/3258*     (2016.01)

(52) U.S. Cl.
    CPC ... *G09G 3/3258* (2013.01); *G09G 2320/0233* (2013.01); *G09G 2320/041* (2013.01); *G09G 2330/021* (2013.01)

(58) Field of Classification Search
    CPC .......... G09G 2320/0233; G09G 3/3208; H01L 51/5203; H01L 27/3276
    See application file for complete search history.

(56) References Cited

U.S. PATENT DOCUMENTS

| | | | | |
|---|---|---|---|---|
| 2008/0088546 | A1* | 4/2008 | Takasugi | G09G 3/3233 345/76 |
| 2008/0158115 | A1* | 7/2008 | Cordes | G09G 3/3233 345/82 |
| 2009/0066617 | A1* | 3/2009 | Chang | G09G 3/3233 345/83 |
| 2010/0060560 | A1* | 3/2010 | Sambandan | G06F 3/038 345/92 |
| 2010/0171733 | A1 | 7/2010 | Kobayashi | |
| 2010/0259468 | A1* | 10/2010 | Omoto | H01L 27/3262 345/77 |
| 2011/0164021 | A1* | 7/2011 | Seto | G09G 3/3233 345/211 |
| 2012/0001893 | A1* | 1/2012 | Jeong | G09G 3/3233 345/213 |
| 2012/0249516 | A1 | 10/2012 | Wacyk et al. | |
| 2013/0043802 | A1* | 2/2013 | Han | G09G 3/3233 315/240 |
| 2013/0119873 | A1 | 5/2013 | Fujita | |
| 2013/0314394 | A1* | 11/2013 | Chaji | G09G 1/002 345/212 |
| 2014/0152642 | A1* | 6/2014 | Kim | G09G 3/3233 345/212 |
| 2014/0225883 | A1* | 8/2014 | Chaji | G09G 3/3233 345/212 |
| 2014/0267215 | A1* | 9/2014 | Soni | G09G 3/3233 345/212 |
| 2014/0340432 | A1* | 11/2014 | Chaji | G09G 3/3258 345/690 |
| 2015/0001504 | A1* | 1/2015 | Kim | H01L 27/32 257/40 |
| 2015/0145850 | A1 | 5/2015 | Rajeev | |
| 2015/0243217 | A1* | 8/2015 | Park | G09G 3/3258 345/76 |
| 2015/0325174 | A1* | 11/2015 | Yu | G09G 3/3233 345/77 |
| 2015/0339976 | A1* | 11/2015 | Tsai | G09G 3/3233 315/172 |
| 2016/0104422 | A1* | 4/2016 | Kishi | G09G 3/006 345/205 |
| 2016/0132171 | A1* | 5/2016 | Hu | G06F 3/0416 345/174 |
| 2016/0155377 | A1* | 6/2016 | Kishi | G09G 3/3233 345/214 |
| 2016/0155385 | A1* | 6/2016 | Yang | G06F 3/03548 345/174 |
| 2016/0260377 | A1* | 9/2016 | Hu | G09G 3/3233 |
| 2016/0284280 | A1* | 9/2016 | Mu | G09G 3/3233 |
| 2017/0018224 | A1* | 1/2017 | Lee | G09G 3/3233 |
| 2017/0018229 | A1* | 1/2017 | Zhang | G09G 3/3233 |
| 2017/0039934 | A1* | 2/2017 | Ma | G09G 3/32 |
| 2017/0193879 | A1* | 7/2017 | Wang | G09G 3/2018 |
| 2017/0206836 | A1* | 7/2017 | Kim | G09G 3/3233 |
| 2017/0309224 | A1* | 10/2017 | Pappas | G09G 3/006 |
| 2018/0130420 | A1* | 5/2018 | Gao | H01L 51/5206 |
| 2018/0130424 | A1* | 5/2018 | Gao | H01L 29/78645 |
| 2018/0158393 | A1* | 6/2018 | Woo | G09G 3/2014 |
| 2018/0226019 | A1* | 8/2018 | Tong | G09G 3/3233 |
| 2018/0315392 | A1* | 11/2018 | Wang | G09G 3/38 |
| 2019/0180685 | A1 | 6/2019 | Zheng | |

FOREIGN PATENT DOCUMENTS

| | | | | |
|---|---|---|---|---|
| CN | 101675462 | A | 3/2010 | |
| CN | 101859791 | A | 10/2010 | |
| CN | 102682721 | A | 9/2012 | |
| CN | 102740567 | A | 10/2012 | |
| CN | 104732926 | A | 6/2015 | |
| CN | 106409233 | A | 2/2017 | |
| CN | 106997747 | A | 8/2017 | |
| JP | 2007232981 | A | 9/2007 | |
| WO | 2010/053495 | A1 | 5/2010 | |
| WO | 2012/011339 | A1 | 1/2012 | |
| WO | WO-2016155207 | A1 * | 10/2016 | .......... G09G 3/3208 |

OTHER PUBLICATIONS

International Search Report for PCT/CN2018/086600 dated Aug. 6, 2018.

* cited by examiner

ORGANIC LIGHT-EMITTING DISPLAY PANEL AND DISPLAY DEVICE

This application is a National Stage of International Application No. PCT/CN2018/086600, filed May 11, 2018, which claims the benefits of Chinese Patent Application No. 201710393127.8, filed with the Chinese Patent Office on May 27, 2017, and entitled "ORGANIC LIGHT-EMITTING DISPLAY AND DISPLAY DEVICE", both of which are hereby incorporated by reference in their entireties.

FIELD

The present disclosure relates to the technical field of display and in particular relates to an organic light-emitting display panel and a display device.

BACKGROUND

An organic light-emitting diode (OLED) display serves as one of hotspots in the field of display research nowadays, and compared with a liquid crystal display (LCD), the OLED display has the advantages such as low energy consumption, low production cost, self-illumination, wide viewing angle and high response speed.

SUMMARY

Some embodiments of the present disclosure provides an organic light-emitting display panel and a display device.

On one hand, the organic light-emitting display panel provided by some embodiments of the present disclosure includes:

a plurality of light-emitting components;

pixel circuits connected one-to-one to the plurality of light-emitting components, the pixel circuits being connected to first poles of the plurality of the light-emitting components, second poles of the plurality of the light-emitting components being connected to first power ends;

diversion modules corresponding one-to-one to the plurality of the light-emitting components, wherein the diversion modules are connected at first ends thereof to the first poles of the plurality of the light-emitting components and connected at second ends thereof to the second poles of the plurality of the light-emitting components;

and the diversion modules are configured to perform diversion with respect to the plurality of the light-emitting components when a temperature of the organic light-emitting display panel satisfies a selected temperature range.

Alternatively, in the organic light-emitting display panel provided by some embodiments of the present disclosure, each of the diversion modules includes M conduction control submodules and diversion control submodules corresponding one-to-one to the conduction control submodules, wherein second ends of the conduction control submodules are respectively connected to the first ends of the diversion control submodules, and second ends of the diversion control submodules are respectively connected to the second poles of the light-emitting components; M is a positive integer;

a first end of a first conduction control submodule is connected to the first pole of the light-emitting component; and a first end of each of remaining conduction control submodules except the first conduction control submodule is connected to a second end of an adjacent former conduction control submodule.

Alternatively, in the organic light-emitting display panel provided by some embodiments of the present disclosure, each of the diversion modules includes M conduction control submodules and diversion control submodules corresponding one-to-one to the conduction control submodules; M is a positive integer;

the first ends of the conduction control submodules are respectively connected to the first poles of the light-emitting components, the second ends of the conduction control submodules are respectively connected to the first ends of the diversion control submodules, and the second ends of the diversion control submodules are respectively connected to the second poles of the light-emitting components.

Alternatively, in the organic light-emitting display panel provided by some embodiments of the present disclosure, each of the conduction control submodules includes a switch, wherein a first end of the switch serves as the first end of the conduction control submodule, and a second end of the switch serves as the second end of the conduction control submodule.

Alternatively, in the organic light-emitting display panel provided by some embodiments of the present disclosure, thermal expansion coefficients of materials of switches in the first to Mth conduction control submodules are sequentially reduced.

Alternatively, in the organic light-emitting display panel provided by some embodiments of the present disclosure, distances between switch contacts of the switches are same.

Alternatively, in the organic light-emitting display panel provided by some embodiments of the present disclosure, the thermal expansion coefficients of the materials of the switches in the first to Mth conduction control submodules are same, and the distances between the switch contacts of the switches in the first to Mth conduction control submodules are sequentially increased.

Alternatively, in the organic light-emitting display panel provided by some embodiments of the present disclosure, the diversion control submodules comprise resistors, wherein first ends of the resistors serve as the first ends of the diversion control submodules, and second ends of the resistors serve as the second ends of the diversion control submodules.

Alternatively, in the organic light-emitting display panel provided by some embodiments of the present disclosure, M is equal to 3 or 5.

On the other hand, some embodiments of the present disclosure further provides a display device comprising any one organic light-emitting display panel provided by some embodiments of the present disclosure.

DETAILED DESCRIPTION OF THE EMBODIMENTS

In order to present the purpose, technical solution and advantages of the present disclosure more explicitly, the description of an organic light-emitting display panel and a display device provided by some embodiments of the present disclosure is explained below in detail in combination with the accompanying drawings. It should be understood that the preferred embodiments described below are only used for describing and explaining the present disclosure, rather than limiting the present disclosure. In addition, some embodiments in this application and features in some embodiments may be combined under the condition that no conflicts are generated.

Different from a LCD of which the brightness is controlled by utilizing a stable voltage, an OLED is driven by a current and is controlled by a stable current to emit light. At present, the OLED is generally driven by pixel circuits to emit light in an OLED display. However, the migration rate of a light-emitting material of the OLED may be increased with the rise of temperature, so that the injected current is increased to make the brightness increased. However, the brightness increments of OLEDs with different colors, such as a red OLED, a green OLED and a blue OLED, are generally different to result in deviation of brightness and color coordinates of a white picture formed by mixing the red OLED, the green OLED and the blue OLED before and after temperature rise and even result in a color deviation phenomenon when the situation is serious, so that the picture display effect is lowered.

Figure 1:
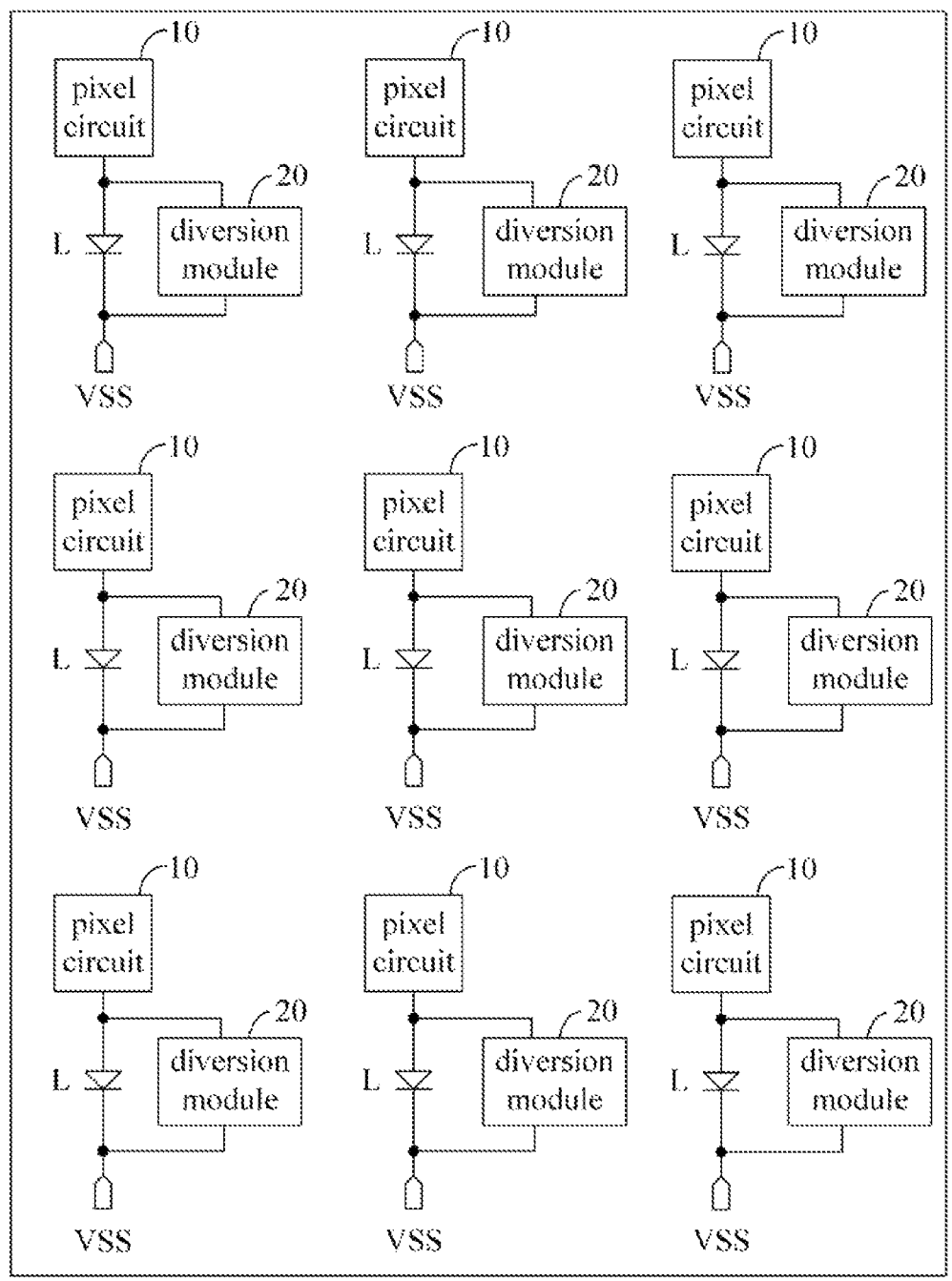
FIG. 1 is a schematic structural diagram of an organic light-emitting display panel provided by some embodiments of the present disclosure.

Some embodiments of the present disclosure provide an organic light-emitting display panel, as shown in FIG. 1, the organic light-emitting display panel includes multiple light-emitting components L and pixel circuits 10 connected one-to-one to the light-emitting components L, the pixel circuits 10 are connected to first poles of corresponding light-emitting components L, and second poles of the light-emitting components L are connected to first power ends VSS; and the organic light-emitting display panel further includes diversion modules 20 corresponding one-to-one to the light-emitting components L, wherein the diversion modules 20 are connected at first ends thereof to the first poles of the corresponding light-emitting components L and connected at second ends to the second poles of the corresponding light-emitting components L.

The diversion modules 20 are configured to perform diversion with respect to the corresponding light-emitting components when the temperature of the organic light-emitting display panel satisfies a selected temperature range.

The organic light-emitting display panel provided by some embodiments of the present disclosure includes multiple light-emitting components, the pixel circuits connected one-to-one to the light-emitting components and the diversion modules corresponding one-to-one to the light-emitting components, wherein the connected light-emitting components are driven by the pixel circuits to emit light, currents flowing through the light-emitting components are subjected to diversion by the diversion modules when the temperature of the organic light-emitting display panel satisfies the selected temperature range, for example, the temperature of the organic light-emitting display panel exceeds the room temperature, so that the currents flowing through the light-emitting components are reduced, furthermore, the brightness of the light-emitting components is prevented from being increased, then, the brightness of the light-emitting components is kept stable, and the picture display effect of the organic light-emitting display panel is improved.

Alternatively, in the organic light-emitting display panel provided by some embodiments of the present disclosure, the selected temperature range may be a range formed by all temperatures greater than 30 DEG C. Of course, the selected temperature range may also be a range formed by temperatures greater than 30 DEG C. and smaller than or equal to 80 DEG C. In an actual application, the organic light-emitting display panel may be applied to display devices with various functions, the requirements of the display devices with the different functions for the selected temperature range are also different, the selected temperature range may be set in advance or regulated in real time according to conditions, and therefore, the selected temperature range is required to be designed and determined according to an actual application environment, there is no restriction herein.

Alternatively, in the organic light-emitting display panel provided by some embodiments of the present disclosure, the light-emitting components are OLEDs. In addition, according to the types of driving transistors in the pixel circuits and connection relationships between the driving transistors and the light-emitting components, the first poles of the light-emitting components are used as positive poles, and the second poles of the light-emitting components are used as negative poles; or the first poles of the light-emitting components are used as negative poles, and the second poles of the light-emitting components are used as positive poles, there is no restriction herein.

Figure 2A:
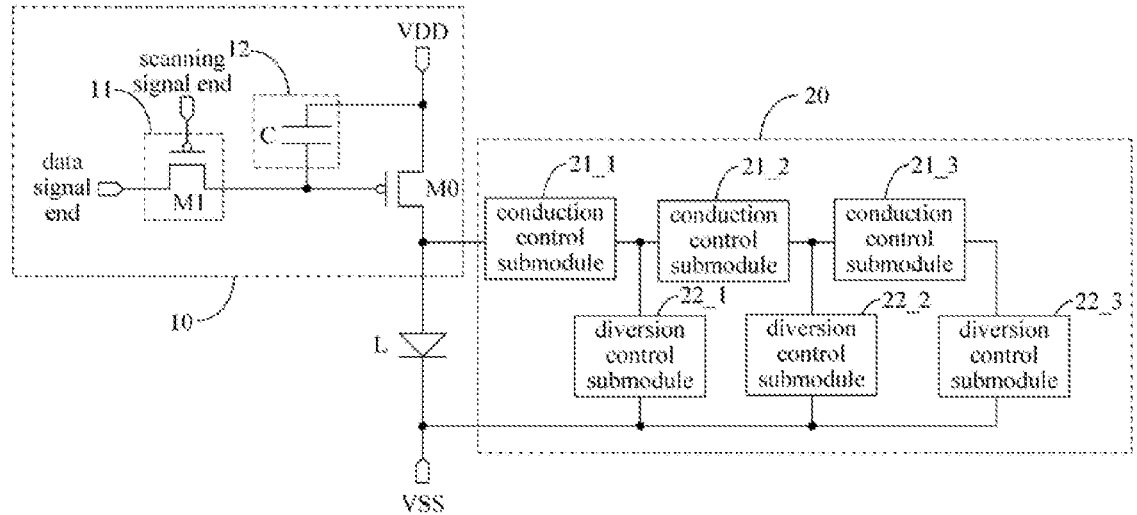
FIG. 2A is a first specific schematic structural diagram of the organic light-emitting display panel provided by some embodiments of the present disclosure.

Alternatively, in the organic light-emitting display panel provided by some embodiments of the present disclosure, as shown in FIG. 2A (for example, three conduction control submodules are provided), each of the diversion modules 20 may specifically include M conduction control submodules 21_$m$ ($m$=1, 2, ... M; and M=3 in FIG. 2A) and diversion control submodules 22_$m$ corresponding one-to-one to the conduction control submodules 21_$m$, wherein the second ends of the conduction control submodules 21_$m$ are respectively connected to the first ends of corresponding diversion control submodules 22_$m$, and the second ends of the diversion control submodules 22_$m$ are respectively connected to the second poles of the corresponding light-emitting components L; M is a positive integer.

The first end of a first conduction control submodule 21_1 is connected to the first pole of the corresponding light-emitting component L; the first end of each of the remaining conduction control submodules 21_$m$ except the first conduction control submodule 21_1 is connected to the second end of the adjacent former conduction control submodule 21_$m$−1.

Alternatively, in the organic light-emitting display panel provided by some embodiments of the present disclosure, as shown in FIG. 2A, the first end of each of the remaining conduction control submodules 21_$m$ is connected to the second end of the adjacent former conduction control submodule 21_$m$−1; specifically, the first end of a second conduction control submodule 21_2 is connected to the second end of the first conduction control submodule 21_1; the first end of a third conduction control submodule 21_3 is connected to the second end of the second conduction control submodule 21_2; the first end of a fourth conduction control submodule is connected to the second end of the third conduction control submodule 21_3; the connection ways of the fifth to Mth conduction control submodules are deduced by analogy and are not described in detail herein.

In order to facilitate understanding, alternatively, in the organic light-emitting display panel provided by some embodiments of the present disclosure, as shown in FIG. 2A, the M conduction control submodules 21_m are defined as the first to Mth conduction control submodules 21_m according to the sequential order of conduction with the temperature rise of the organic light-emitting display panel; the selected temperature range is also divided into M selected temperature subranges according to the order of temperatures from low to high, and thus, the first to mth conduction control submodules may be used for conducting the first ends and the second ends thereof when the temperature of the organic light-emitting display panel satisfies the mth selected temperature subrange; m is an integer which is greater than or equal to 1 and is smaller than or equal to M. For example, as shown in FIG. 2A, the first conduction control submodule is capable of conducting the first end and the second end thereof when M is equal to 3 and the temperature of the organic light-emitting display panel satisfies the first selected temperature subrange, so that a diversion control submodule 22_1 is connected in parallel with the light-emitting component L. The second conduction control submodule also conducts the first end and the second end thereof on the basis of conducting the first conduction control submodule when the temperature of the organic light-emitting display panel satisfies the second selected temperature subrange, so that a diversion control submodule 22_2 is also connected in parallel with the light-emitting component L, namely the diversion control submodule 22_1 and the diversion control submodule 22_2 are simultaneously connected in parallel with the light-emitting component L. The third conduction control submodule also conducts the first end and the second end thereof on the basis of conducting the first conduction control submodule and the second conduction control submodule when the temperature of the organic light-emitting display panel satisfies the third selected temperature subrange, so that a diversion control submodule 22_3 is also connected in parallel with the light-emitting component L, namely the diversion control submodule 22_1 to the diversion control submodule 22_3 are simultaneously connected in parallel with the light-emitting component L. Of course, M may also be other values, which is designed and determined according to an actual application environment, and there is no restriction herein.

Figure 2B:
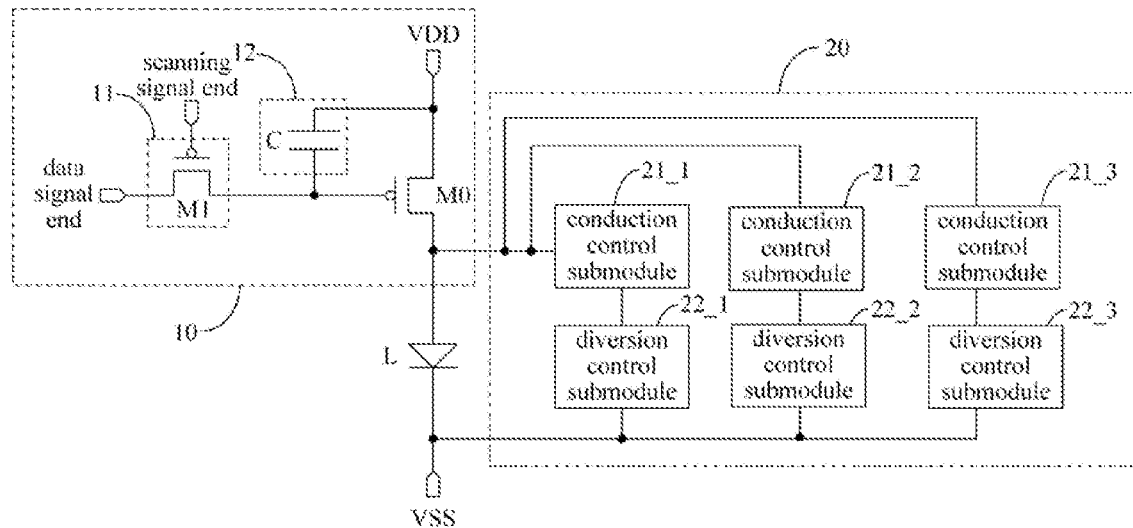
FIG. 2B is a second specific schematic structural diagram of the organic light-emitting display panel provided by some embodiments of the present disclosure.

Alternatively, in the organic light-emitting display panel provided by some embodiments of the present disclosure, as shown in FIG. 2B (for example, three conduction control submodules are provided), each of the diversion modules 20 may also specifically comprise M conduction control submodules 21_m (m=1, 2, 3 . . . M, wherein M=3) and diversion control submodules 22_m corresponding one-to-one to the conduction control submodules 21_m; M is a positive integer.

The first ends of the conduction control submodules 21_m are respectively connected to the first poles of the corresponding light-emitting components L, the second ends of the conduction control submodules 21_m are respectively connected to the corresponding first ends of the diversion control submodules 22_m, and the second ends of the diversion control submodules 22_m are respectively connected to the corresponding second poles of the light-emitting components L.

In order to facilitate understanding, alternatively, in the organic light-emitting display panel provided by some embodiments of the present disclosure, as shown in FIG. 2B, the M conduction control submodules 21_m are defined as the first to Mth conduction control submodules 21_m according to the sequential order of conduction with the temperature rise of the organic light-emitting display panel; the selected temperature range is also divided into M selected temperature subranges according to the order of temperatures from low to high, and the first to mth conduction control submodules are used for conducting the first ends and the second ends thereof when the temperature of the organic light-emitting display panel satisfies the mth selected temperature subrange; m is an integer which is greater than or equal to 1 and is smaller than or equal to M. For example, as shown in FIG. 2B, the first conduction control submodule is capable of conducting the first end and the second end thereof when M is equal to 3 and the temperature of the organic light-emitting display panel satisfies the first selected temperature subrange, so that a diversion control submodule 22_1 is connected in parallel with the light-emitting component L. The second conduction control submodule also conducts the first end and the second end thereof on the basis of conducting the first conduction control submodule when the temperature of the organic light-emitting display panel satisfies the second selected temperature subrange, so that a diversion control submodule 22_2 is also connected in parallel with the light-emitting component L, namely the diversion control submodule 22_1 and the diversion control submodule 22_2 are simultaneously connected in parallel with the light-emitting component L. The third conduction control submodule also conducts the first end and the second end thereof on the basis of conducting the first conduction control submodule and the second conduction control submodule when the temperature of the organic light-emitting display panel satisfies the third selected temperature subrange, so that a diversion control submodule 22_3 is also connected in parallel with the light-emitting component L, namely the diversion control submodule 22_1 to the diversion control submodule 22_3 are simultaneously connected in parallel with the light-emitting component L. Of course, M may also be other values, which is designed and determined according to an actual application environment, and there is no restriction herein.

Alternatively, in the organic light-emitting display panel provided by some embodiments of the present disclosure, the selected temperature range may be specifically divided into three selected temperature subranges according to the order of temperatures from low to high, namely M is equal to 3, and therefore, the three selected temperature subranges are respectively the first to third selected temperature subranges. In an actual application, the temperature of the organic light-emitting display panel is generally between the room temperature (generally 27 DEG C.) and 80 DEG C., and influences of brightness variation of the organic light-emitting display panel to a display picture may be within an error allowable range or a viewer acceptable range when the temperature satisfies a range of greater than or equal to 27 DEG C. and is smaller than 30 DEG C., so that the first selected temperature subrange may be greater than or equal to 30 DEG C. and smaller than 40 DEG C.; the second selected temperature subrange may be greater than or equal to 40 DEG C. and smaller than 60 DEG C.; the third selected temperature subrange may be greater than or equal to 60 DEG C. and smaller than 80 DEG C.

Or the selected temperature range may be specifically divided into five selected temperature subranges according to the order of temperatures from low to high, namely M is equal to 5, and therefore, the five selected temperature subranges are respectively the first to fifth selected temperature subranges. In an actual application, the temperature of the organic light-emitting display panel is generally between the room temperature (generally 27 DEG C.) and 80 DEG C., and influences of brightness variation of the organic light-emitting display panel to a display picture may be within an error allowable range or a viewer acceptable range when the temperature satisfies a range of greater than or equal to 27 DEG C. and is smaller than 30 DEG C., so that the first selected temperature subrange may be greater than or equal to 30 DEG C. and smaller than 40 DEG C.; the second selected temperature subrange may be greater than or equal to 40 DEG C. and greater than 50 DEG C.; the third selected temperature subrange may be greater than or equal to 50 DEG C. and smaller than 60 DEG C.; the fourth selected temperature subrange may be greater than or equal to 60 DEG C. and smaller than 70 DEG C.; the fifth selected temperature subrange may be greater than or equal to 70 DEG C. and smaller than 80 DEG C.

The present disclosure is described below in detail in combination with specific embodiments. It should be noted that some embodiments are intended to better explain the present disclosure, rather than limit the present disclosure.

Alternatively, in the organic light-emitting display panel provided by some embodiments of the present disclosure, as shown in FIG. 3A to FIG. 4B, each of the conduction control submodules $21\_m$ may specifically include a switch $S\_m$, where the first end of the switch $S\_m$ serves as the first end of the conduction control submodule $21\_m$, and the second end of the switch $S\_m$ serves as the second end of the conduction control submodule $21\_m$.

Figure 3A:
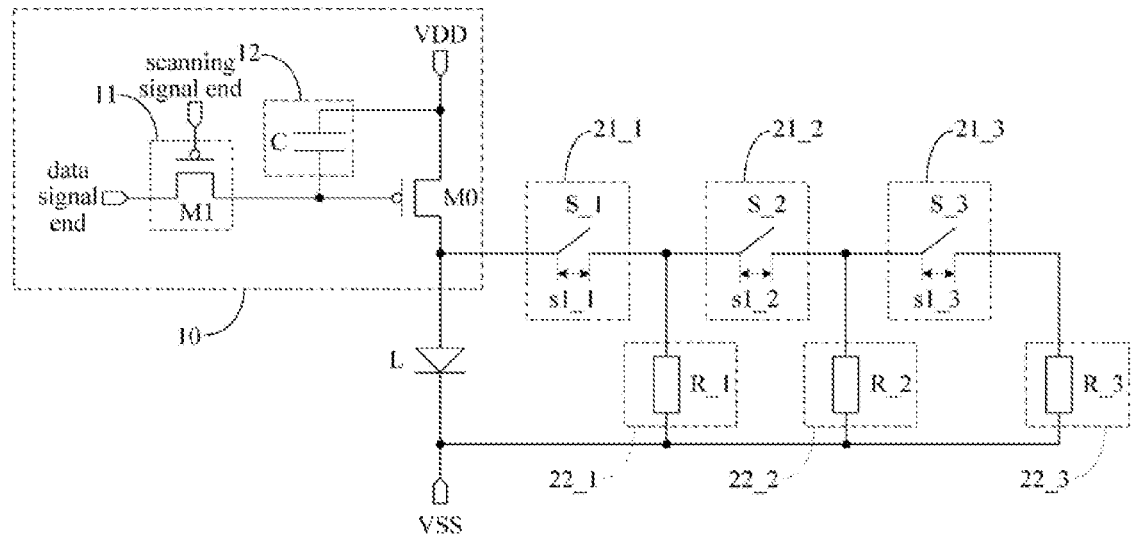
FIG. 3A is a first specific schematic structural diagram of the organic light-emitting display panel as shown in FIG. 2A.
Figure 3B:
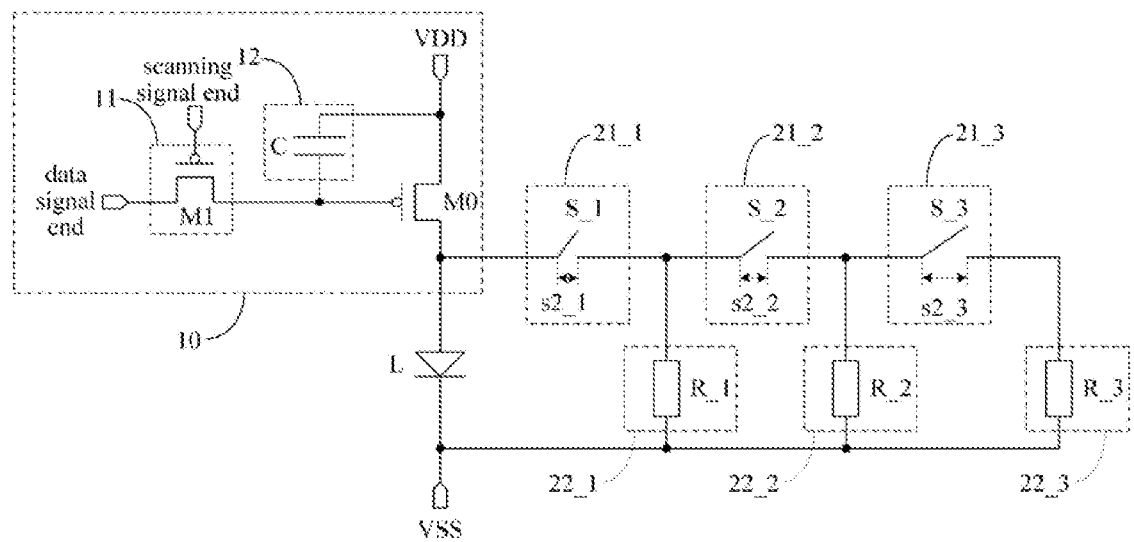
FIG. 3B is a second specific schematic structural diagram of the organic light-emitting display panel as shown in FIG. 2A.

Alternatively, in the organic light-emitting display panel provided by some embodiments of the present disclosure, as shown in FIG. 3A to FIG. 3B, the first end of a switch $S\_1$ is connected to the positive pole of corresponding light-emitting component L, the second end of switch $S\_1$ is connected to the first end of a switch $S\_2$, the second end of the switch $S\_2$ is connected to the first end of a switch $S\_3$, and the second end of the switch $S\_3$ is connected to the first end of the corresponding diversion control submodule $22\_3$; the connection ways of the remaining switches are deduced by analogy and are not described in detail herein.

Figure 4A:
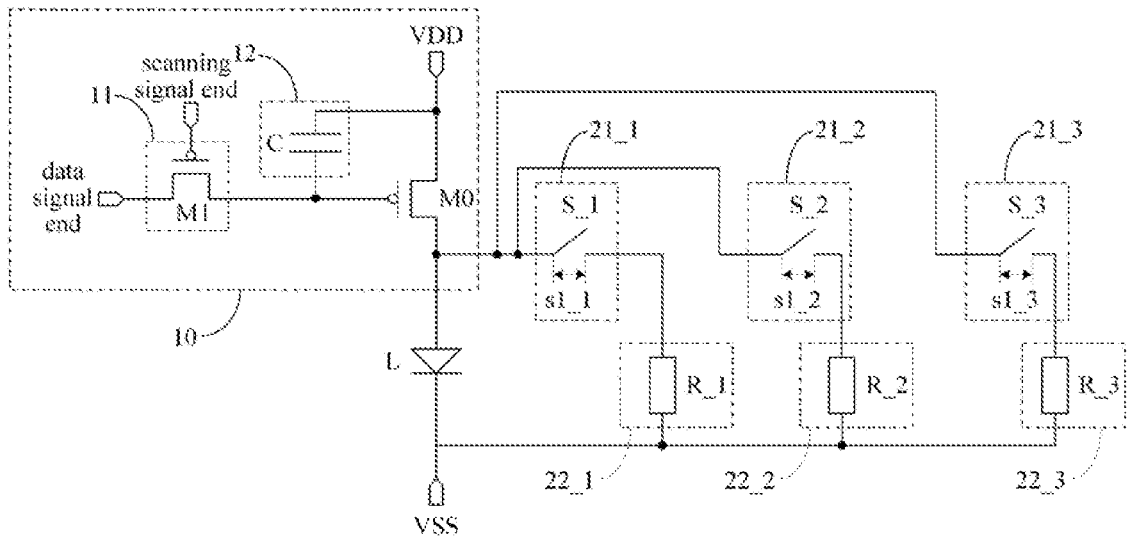
FIG. 4A is a first specific schematic structural diagram of the organic light-emitting display panel as shown in FIG. 2B.
Figure 4B:
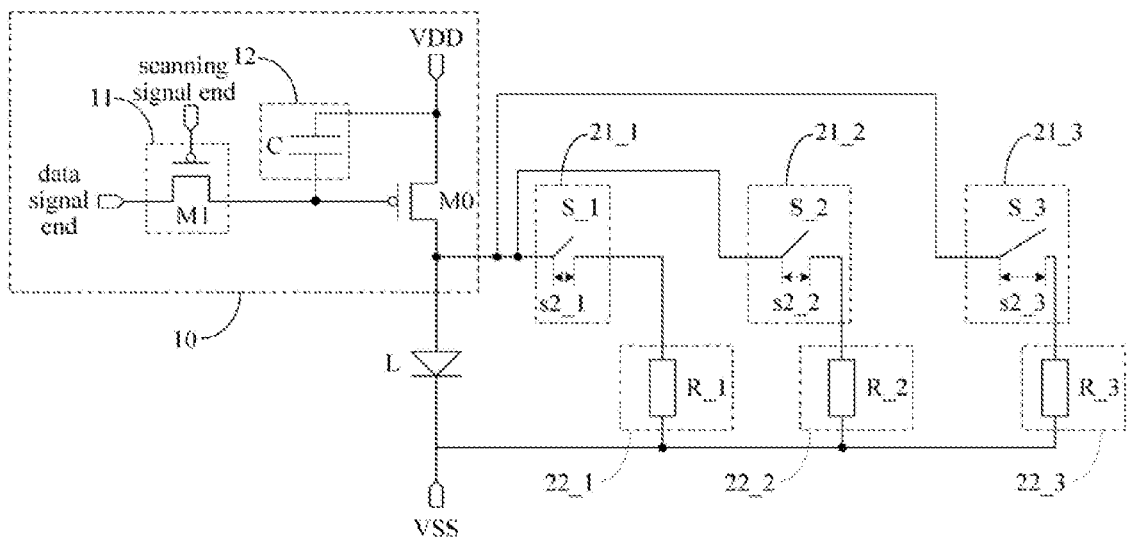
FIG. 4B is a second specific schematic structural diagram of the organic light-emitting display panel as shown in FIG. 2B.

Alternatively, in the organic light-emitting display panel provided by some embodiments of the present disclosure, as shown in FIG. 4A to FIG. 4B, the first end of the switch $S\_1$ is connected to the positive pole of the corresponding light-emitting component L, and the second end of switch $S\_1$ is connected to the first end of the corresponding diversion control submodule $22\_1$; the first end of the switch $S\_2$ is connected to the positive pole of the corresponding light-emitting component L, and the second end of the switch $S\_2$ is connected to the first end of the corresponding diversion control submodule $22\_2$; the first end of the switch $S\_3$ is connected to the positive pole of the corresponding light-emitting component L, and the second end of the switch $S\_3$ is connected to the first end of the corresponding diversion control submodule $22\_3$; the connection ways of the remaining switches are deduced by analogy and are not described in detail herein.

Alternatively, in the organic light-emitting display panel provided by some embodiments of the present disclosure, the materials of the switches in the first to Mth conduction control submodules may be materials with thermal expansion properties. For example, the materials may be metal materials. In an actual application, the materials of the switches are required to be designed and determined according to an actual application environment, there is no restriction herein.

The thermal expansion properties of general materials are expressed by thermal expansion coefficients, alternatively, in the organic light-emitting display panel provided by some embodiments of the present disclosure, the thermal expansion coefficients of the materials of the switches in the first to Mth conduction control submodules are sequentially reduced, namely the thermal expansion coefficient of the switch in the first conduction control submodule is the largest, the thermal expansion coefficient of the switch in the second conduction control submodule is the second largest, the thermal expansion coefficient of the switch in the third conduction control submodule is the third largest, and the thermal expansion coefficients of the switches in the remaining conduction control submodules are deduced by analogy until the thermal expansion coefficient of the switch in the Mth conduction control submodule is the smallest. Thus, the switches in the first to Mth conduction control submodules may be controlled to be sequentially conducted by thermal expansion when the temperature of the organic light-emitting display panel is raised, so that the currents flowing through the connected light-emitting components are sequentially subjected to diversion. In addition, in an actual application, the thermal expansion coefficients are required to be designed and determined according to an actual application environment, there is no restriction herein.

Alternatively, in the organic light-emitting display panel provided by some embodiments of the present disclosure, as shown in FIG. 3A to FIG. 4A, a distance $s1\_m$ between switch contacts of each of the switches $S\_m$ is same when the thermal expansion coefficients of the materials of the switches $S\_m$ in the first to Mth conduction control submodules $21\_m$ are sequentially reduced. Of course, the distance $s1\_m$ between the switch contacts of each of the switches $S\_m$ may also be different under the condition that the switches $S\_m$ in the first to Mth conduction control submodules are guaranteed to be sequentially conducted, which is required to be designed and determined according to an actual application environment, there is no restriction herein.

Of course, alternatively, in the organic light-emitting display panel provided by some embodiments of the present disclosure, the thermal expansion coefficients of the materials of the switches in the first to Mth conduction control submodules may also be same, but the distances between the switch contacts of the switches in the first to Mth conduction control submodules are sequentially increased. Thus, the switches in the first to Mth conduction control submodules may be controlled to be sequentially conducted by thermal expansion when the temperature of the organic light-emitting display panel is raised, so that the currents flowing through the connected light-emitting components are sequentially subjected to diversion. Specifically, as shown in FIG. 3B and FIG. 4B, a distance $s2\_1$ between the switch contacts of the switch $S\_1$ in the first conduction control submodule $21\_1$ is the shortest, a distance $s2\_2$ between the switch contacts of the switch $S\_2$ in the second conduction control submodule $21\_2$ is longer than the $s2\_1$, a distance $s2\_3$ between the switch contacts of the switch $S\_3$ in the third conduction control submodule $21\_3$ is longer than the $s2\_2$, and distances $s2\_m$ between the switch contacts of the switches $S\_m$ in the remaining conduction control submodules $21\_m$ are deduced by analogy until the distance $s2\_M$ between the switch contacts of the switch S_M in the Mth conduction control submodule 21_M is the longest, the detailed descriptions thereof are omitted herein.

Alternatively, in the organic light-emitting display panel provided by some embodiments of the present disclosure, as shown in FIG. 3A to FIG. 4B, the diversion control submodules 22_m may specifically include resistors R_m, wherein the first ends of the resistors R_m serve as the first ends of the diversion control submodules 22_m, and the second ends of the resistors R_m serve as the second ends of the diversion control submodules 22_m.

Alternatively, in the organic light-emitting display panel provided by some embodiments of the present disclosure, the resistance value of the resistor in each of the diversion control submodules may be same or different. In an actual application, the resistance value of the resistor in each of the diversion control submodules is required to be designed and determined according to an actual application environment, there is no restriction herein.

In an actual application, a general pixel circuit includes various structures, alternatively, in the organic light-emitting display panel provided by some embodiments of the present disclosure, as shown in FIG. 2A to FIG. 4B, each of the pixel circuits 10 may specifically include a writing-in transistor M1, a capacitor C and a driving transistor M0, wherein a first pole of the driving transistor M0 is connected to a second power end VDD, and a second pole of the driving transistor M0 is connected to the positive pole of the corresponding light-emitting component L.

A control electrode of the writing-in transistor M1 is connected to a scanning signal end Scan, a first pole of the writing-in transistor M1 is connected to a data signal end Data, and a second pole of the writing-in transistor M1 is connected to a control electrode of the driving transistor M0; the writing-in transistor M1 is used for providing a signal of the data signal end Data to the control electrode of the driving transistor M0 under the control of the scanning signal end Scan.

the capacitor C is respectively connected to the control electrode of the driving transistor M0 and the second power end VDD and is used for recharging under the control of a signal of the control electrode of the driving transistor M0 and a signal of the second power end VDD and keeping a voltage difference of the control electrode of the driving transistor M0 and the second power end VDD stable when the control electrode of the driving transistor M0 is in a floating connection state.

The driving transistor M0 is used for driving the connected light-emitting component L to emit light under the control of the signal of the control electrode of the driving transistor M0 and the signals of the first power end VSS and the second power end VDD.

In specific implementation, the control electrode may be used as a grid electrode, the first pole may be used as a source electrode or a drain electrode, and the second pole may be used as a drain electrode or a source electrode according to different types of the transistors and different input signals.

Alternatively, in the organic light-emitting display panel provided by some embodiments of the present disclosure, the specific working process of the pixel circuit is same as the working process of a pixel circuit with a 2T1C structure in the prior art, the working process should be understood as a provided working process by the ordinary skilled in the art, is not described in detail herein and should not limit the present disclosure.

The specific structures of the diversion modules and the pixel circuits in the organic light-emitting display panel provided by some embodiments of the present disclosure are only illustrated above, and alternatively, the specific structures of the diversion modules and the pixel circuits are not limited to the structures provided by some embodiments of the present disclosure and may be other structures known by the skilled in the art, there is no restrictions herein.

The working process of the organic light-emitting display panel provided by some embodiments of the present disclosure is described below by respectively taking the structures as shown in FIG. 3A and FIG. 3B and the condition that the selected temperature range may be specifically divided into the three selected temperature subranges according to the order of temperatures from low to high as examples, wherein the first selected temperature subrange is greater than or equal to 30 DEG C. and is smaller than 40 DEG C.; the second selected temperature subrange is greater than or equal to 40 DEG C. and is smaller than 60 DEG C.; the third selected temperature subrange is greater than or equal to 60 DEG C. and is smaller than 80 DEG C. In addition, $U_0$ represents for a voltage between the second power end VDD and the first power end VSS, $U_1$ represents for voltages of the first pole and the second pole of the driving transistor M0, $U_2$ represents for voltages of the positive pole and negative pole of each of the light-emitting components L, $r_1$ represents for the resistance value of the driving transistor M0, $r_2$ represents for the resistance value of each of the light-emitting components L, and $r_{3\_m}$ represents for the resistance value of each of the resistors R_m. In addition, all the following descriptions are realized on the basis that an OLED serves as the light-emitting component.

In one of some embodiments, the structure of the organic light-emitting display panel as shown in FIG. 3A is taken as an example.

When the temperature of the organic light-emitting display panel is greater than or equal to 27 DEG C. and is smaller than 30 DEG C., the switch S_1, the switch S_2 and the switch S_3 are in a turned-off state, and therefore, the resistance value $r_0$ between the second power end VDD and the first power end VSS meets a formula: $r_0 = r_1 + r_2$ at this moment.

When the temperature of the organic light-emitting display panel is greater than or equal to 30 DEG C. and is smaller than 40 DEG C., the switch S_1 is turned on to conduct the positive pole of the light-emitting component L and the resistor R_1, so that the resistor R_1 is connected in parallel with the light-emitting component L. While both the switch S_2 and the switch S_3 are in a turned-off state, and therefore, the resistance value $r_0'$ between the second power end VDD and the first power end VSS meets a formula:

$$r_0' = r_1 + \frac{r_2 * r_{3\_1}}{r_2 + r_{3\_1}}$$

at this moment. The $U_0$ is constant, so that the current between the second power end VDD and the first power end VSS is increased, according to the Ohm law and the formula: $U_0 = U_1 + U_2$, if $U_1$ is increased, $U_2$ is reduced, namely the voltages at two ends of the light-emitting component L are reduced. However, the light-emitting material of the OLED is increased in the migration rate and reduced in the resistance value $r_2$ with the rise of the temperature when the OLED serves as the light-emitting component L, and therefore, the OLED may achieve the brightness before the temperature reaches 30 DEG C. at a relatively small current, and furthermore, the color deviation of white light formed after the OLEDs with different colors are mixed may be relieved.

When the temperature of the organic light-emitting display panel is greater than or equal to 40 DEG C. and is smaller than 60 DEG C., the switch S_1 is turned on to conduct the positive pole of the light-emitting component L and the resistor R_1, and the switch S_2 is turned on to conduct the positive pole of the light-emitting component L and the resistor R_2, so that the resistor R_1 and the resistor R_2 are respectively connected in parallel with the light-emitting component L. While the switch S_3 is in a turned-off state, and therefore, the resistance value $r_0''$ between the second power end VDD and the first power end VSS meets a formula:

$$r_0'' = r_1 + \frac{r_2 * r_{3\_1} * r_{3\_2}}{r_2 * r_{3\_2} + r_2 * r_{3\_1} * r_{3\_2} * r_{3\_2}}$$

at this moment. The $U_0$ is constant, so that the current between the second power end VDD and the first power end VSS is further increased, according to the Ohm law and the formula: $U_0 = U_1 + U_2$, if $U_1$ is further increased, $U_2$ is further reduced, namely the voltages at two ends of the light-emitting component L are further reduced. However, the light-emitting material of the OLED is increased in the migration rate and reduced in the resistance value $r_2$ with the rise of the temperature when the OLED serves as the light-emitting component L, and therefore, the OLED may achieve the brightness before the temperature reaches 30 DEG C. at a relatively small current, and furthermore, the color deviation of white light formed after the OLEDs with different colors are mixed may be relieved.

When the temperature of the organic light-emitting display panel is greater than or equal to 60 DEG C. and is smaller than 80 DEG C., the switch S_1 is turned on to conduct the positive pole of the light-emitting component L and the resistor R_1, the switch S_2 is turned on to conduct the positive pole of the light-emitting component L and the resistor R_2, and the switch S_3 is turned on to conduct the positive pole of the light-emitting component L and the resistor R_3, so that the resistor R_1, the resistor R_2 and the resistor R_3 are respectively connected in parallel with the light-emitting component L. Therefore, the resistance value $r_0'''$ between the second power end VDD and the first power end VSS meets a formula:

$$r_0''' = r_1 + \frac{r_2 * r_{3\_1} * r_{3\_2} * r_{3\_3}}{r_2 * r_{3\_2} * r_{3\_3} + r_2 * r_{3\_1} * r_{3\_3} + r_{3\_1} * r_{3\_2} * r_{3\_3} + r_2 * r_{3\_1} * r_{3\_2}}$$

at this moment. The $U_0$ is constant, so that the current between the second power end VDD and the first power end VSS is further increased, according to the Ohm law and the formula: $U_0 = U_1 + U_2$, if $U_1$ is further increased, $U_2$ is further reduced, namely the voltages at two ends of the light-emitting component L are further reduced. However, the light-emitting material of the OLED is increased in the migration rate and reduced in the resistance value $r_2$ with the rise of the temperature when the OLED serves as the light-emitting component L, and therefore, the OLED may achieve the brightness before the temperature reaches 30 DEG C. at a relatively small current, and furthermore, the color deviation of white light formed after the OLEDs with different colors are mixed may be relieved.

When the organic light-emitting display panel includes more switches and more resistors, the amount of the resistors connected in parallel with the light-emitting components may also be increased with the rise of the temperature of the organic light-emitting display panel, so that the aim of diversion with respect to the light-emitting components is achieved, furthermore, the brightness of the light-emitting components is reduced, and thus, the color deviation of the white light formed after the OLEDs with different colors are mixed may be relieved.

The working process of the structure of the organic light-emitting display panel as shown in FIG. 4A is basically same as that of the organic light-emitting display panel as shown in FIG. 3A and is not described in detail herein.

In the other embodiment, the structure of the organic light-emitting display panel as shown in FIG. 3B is taken as an example.

When the temperature of the organic light-emitting display panel is greater than or equal to 27 DEG C. and is smaller than 30 DEG C., the switch S_1, the switch S_2 and the switch S_3 are in a turned-off state, and therefore, the resistance value $r_0$ between the second power end VDD and the first power end VSS meets a formula: $r_0 = r_1 + r_2$ at this moment.

When the temperature of the organic light-emitting display panel is greater than or equal to 30 DEG C. and is smaller than 40 DEG C., the switch S_1 is turned on to conduct the positive pole of the light-emitting component L and the resistor R_1, so that the resistor R_1 is connected in parallel with the light-emitting component L. While both the switch S_2 and the switch S_3 are in a turned-off state, and therefore, the resistance value $r_0'$ between the second power end VDD and the first power end VSS meets a formula:

$$r_0' = r_1 + \frac{r_2 * r_{3\_1}}{r_2 + r_{3\_1}}$$

at this moment. The $U_0$ is constant, so that the current between the second power end VDD and the first power end VSS is increased, according to the Ohm law and the formula: $U_0 = U_1 + U_2$, if $U_1$ is increased, $U_2$ is reduced, namely the voltages at two ends of the light-emitting component L are reduced. However, the light-emitting material of the OLED is increased in the migration rate and reduced in the resistance value $r_2$ with the rise of the temperature when the OLED serves as the light-emitting component L, and therefore, the OLED may achieve the brightness before the temperature reaches 30 DEG C. at a relatively small current, and furthermore, the color deviation of white light formed after the OLEDs with different colors are mixed may be relieved.

When the temperature of the organic light-emitting display panel is greater than or equal to 40 DEG C. and is smaller than 60 DEG C., the switch S_1 is turned on to conduct the positive pole of the light-emitting component L and the resistor R_1, and the switch S_2 is turned on to conduct the positive pole of the light-emitting component L and the resistor R_2, so that the resistor R_1 and the resistor R_2 are respectively connected in parallel with the light-emitting component L. While the switch S_3 is in a turned-off state, and therefore, the resistance value $r_0''$ between the second power end VDD and the first power end VSS meets a formula:

$$r_0'' = r_1 + \frac{r_2 * r_{3\_1} * r_{3\_2}}{r_2 * r_{3\_2} + r_2 * r_{3\_1} + r_{3\_1} * r_{3\_2}}$$

at this moment. The $U_0$ is constant, so that the current between the second power end VDD and the first power end VSS is further increased, according to the Ohm law and the formula: $U_0 = U_1 + U_2$, if $U_1$ is further increased, $U_2$ is further reduced, namely the voltages at two ends of the light-emitting component L are further reduced. However, the light-emitting material of the OLED is increased in the migration rate and reduced in the resistance value $r_2$ with the rise of the temperature when the OLED serves as the light-emitting component L, and therefore, the OLED may achieve the brightness before the temperature reaches 30 DEG C. at a relatively small current, and furthermore, the color deviation of white light formed after the OLEDs with different colors are mixed may be relieved.

When the temperature of the organic light-emitting display panel is greater than or equal to 60 DEG C. and is smaller than 80 DEG C., the switch S_1 is turned on to conduct the positive pole of the light-emitting component L and the resistor R_1, the switch S_2 is turned on to conduct the positive pole of the light-emitting component L and the resistor R_2, and the switch S_3 is turned on to conduct the positive pole of the light-emitting component L and the resistor R_3, so that the resistor R_1, the resistor R_2 and the resistor R_3 are respectively connected in parallel with the light-emitting component L. Therefore, the resistance value $r_0'''$ between the second power end VDD and the first power end VSS meets a formula:

$$r_0''' = r_1 + \frac{r_2 * r_{3\_1} * r_{3\_2} * r_{3\_3}}{r_2 * r_{3\_2} * r_{3\_3} + r_2 * r_{3\_1} * r_{3\_3} + r_{3\_1} * r_{3\_2} * r_{3\_3} + r_2 * r_{3\_1} * r_{3\_2}}$$

at this moment. The $U_0$ is constant, so that the current between the second power end VDD and the first power end VSS is further increased, according to the Ohm law and the formula: $U_0 = U_1 + U_2$, if $U_1$ is further increased, $U_2$ is further reduced, namely the voltages at two ends of the light-emitting component L are further reduced. However, the light-emitting material of the OLED is increased in the migration rate and reduced in the resistance value $r_2$ with the rise of the temperature when the OLED serves as the light-emitting component L, and therefore, the OLED may achieve the brightness before the temperature reaches 30 DEG C. at a relatively small current, and furthermore, the color deviation of white light formed after the OLEDs with different colors are mixed may be relieved.

When the organic light-emitting display panel includes more switches and more resistors, the amount of the resistors connected in parallel with the light-emitting components may also be increased with the rise of the temperature of the organic light-emitting display panel, so that the aim of diversion with respect to the light-emitting components is achieved, furthermore, the brightness of the light-emitting components is reduced, and thus, the color deviation of the white light formed after the OLEDs with different colors are mixed may be relieved.

The working process of the structure of the organic light-emitting display panel as shown in FIG. 4B is basically same as that of the organic light-emitting display panel as shown in FIG. 3B and is not described in detail herein.

In the two embodiments, all the switches are sequentially turned off according to the order from the switch S_m to the switch S_1 with the reduction of the temperature of the organic light-emitting display panel. Therefore, the resistors are prevented from being connected in parallel with the light-emitting components when the temperature of the organic light-emitting display panel is greater than or equal to 27 DEG C. and is smaller than 30 DEG C., and furthermore, influences of the resistors to the currents flowing through the light-emitting components may be avoided at the moment.

Based on the same inventive concept, some embodiments of the present disclosure further provide a display device including any one organic light-emitting display panel provided by some embodiments of the present disclosure. The implementation of the display device may refer to some embodiments of the organic light-emitting display panel, and the repeated part is not described in detail herein.

Alternatively, the display device provided by some embodiments of the present disclosure may be any one product or part with a display function, such as a mobile phone, a tablet computer, a television, a display, a notebook computer, a digital photo frame and a navigating instrument. Other essential parts of the display device should be understood as provided parts by the ordinary skilled in the art, are not described in detail herein and should not limit the present disclosure.

According to the organic light-emitting display panel and the display device provided by some embodiments of the present disclosure, the organic light-emitting display panel includes multiple light-emitting components, the pixel circuits connected one-to-one to the light-emitting components and the diversion modules corresponding one-to-one to the light-emitting components, wherein the connected light-emitting components are driven by the pixel circuits to emit light, currents flowing through the connected light-emitting components may be subjected to diversion by the diversion modules when the temperature of the organic light-emitting display panel satisfies the selected temperature range, for example, the temperature of the organic light-emitting display panel exceeds the room temperature, so that the currents flowing through the light-emitting components are reduced, furthermore, the brightness of the light-emitting components is prevented from being increased, then, the brightness of the light-emitting components is kept stable, and the picture display effect of the organic light-emitting display panel is improved.

It is apparent that various alterations and variations may be made by the skilled in the art without departing from the spirit and scope of the present disclosure. Thus, the alterations and variations are also intended to be contained in the present disclosure if falling into the scope of claims of the present disclosure and equivalent technologies thereof.

The invention claimed is:

1. An organic light-emitting display panel, comprising:
   a plurality of light-emitting components;
   diversion modules corresponding to at least one of the plurality of light-emitting components, wherein the diversion modules are connected at first ends thereof to the first poles of at least one of the plurality of light-emitting components and connected at second ends thereof to the second poles of at least one of the plurality of light-emitting components, and the diversion modules are configured to perform diversion with respect to at least one of the plurality of light-emitting components when a temperature of the organic light-emitting display panel satisfies a selected temperature range;

wherein each of the diversion modules is connected in parallel with at least one of the plurality of light-emitting components;

wherein each of the diversion modules comprises M conduction control submodules and diversion control submodules corresponding one-to-one to the conduction control submodules, second ends of the conduction control submodules are respectively connected to first ends of the diversion control submodules, and second ends of the diversion control submodules are respectively connected to the second poles of at least one of the plurality of the light-emitting components; M is a positive integer; wherein each of the conduction control submodules comprises a contact switch;

a first end of a first conduction control submodule is connected to the first pole of the light-emitting component; a first end of each of remaining conduction control submodules except the first conduction control submodule is connected to the second end of an adjacent former conduction control submodule;

wherein a first end of the switch serves as the first end of the conduction control submodule, and a second end of the switch serves as the second end of the conduction control submodule;

thermal expansion coefficients of materials of switches in the first to Mth conduction control submodules are sequentially reduced, and distances between switch contacts of the switches are same; or thermal expansion coefficients of the materials of switches in the first to Mth conduction control submodules are same, and distances between the switch contacts of the switches in the first to Mth conduction control submodules are sequentially increased.

2. The organic light-emitting display panel of claim 1, wherein the diversion control submodules comprise resistors; and first ends of the resistors serve as the first ends of the diversion control submodules, and second ends of the resistors serve as the second ends of the diversion control submodules.

3. The organic light-emitting display panel of claim 1, wherein M is equal to 3 or 5.

4. A display device, wherein the display device comprises the organic light-emitting display panel of claim 1.

5. The display device of claim 4, wherein the diversion control submodules comprise resistors; and first ends of the resistors serve as the first ends of the diversion control submodules, and second ends of the resistors serve as the second ends of the diversion control submodules.

6. The organic light-emitting display panel of claim 1, further comprises:
pixel circuits connected one-to-one to the plurality of light-emitting components, the pixel circuits being connected to first poles of the plurality of light-emitting components, second poles of the plurality of light-emitting components being connected to first power ends.

7. The organic light-emitting display panel of claim 1, wherein the diversion modules corresponds one-to-one to the plurality of light-emitting components.

8. The organic light-emitting display panel of claim 1, wherein the selected temperature range is formed by temperatures greater than 30 DEG C.

* * * * *